United States Patent
Budelman

(10) Patent No.: US 6,244,331 B1
(45) Date of Patent: Jun. 12, 2001

(54) HEATSINK WITH INTEGRATED BLOWER FOR IMPROVED HEAT TRANSFER

(75) Inventor: Gerald A. Budelman, Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/425,639

(22) Filed: Oct. 22, 1999

(51) Int. Cl.$^7$ .................................................... F28F 7/00
(52) U.S. Cl. ........................ 165/80.3; 165/121; 165/185; 361/695; 361/697; 176/16.3; 257/722
(58) Field of Search ..................... 165/80.3, 185, 165/104.33, 121; 361/697, 704, 689, 690, 695, 702, 703, 709; 174/16.3; 257/706, 722

(56) References Cited

U.S. PATENT DOCUMENTS

| | | | |
|---|---|---|---|
| 3,313,339 | * 4/1967 | Coe | 165/80.3 |
| 4,790,374 | 12/1988 | Jacoby . | |
| 4,884,331 | * 12/1989 | Hinshaw | 165/80.3 |
| 4,899,210 | * 2/1990 | Lorenzetti et al. | 165/80.4 |
| 5,394,936 | 3/1995 | Budelman . | |
| 5,469,330 | * 11/1995 | Karabatsos et al. | 361/704 |
| 5,535,094 | 7/1996 | Nelson et al. . | |
| 5,584,339 | * 12/1996 | Hong | 165/80.3 |
| 5,597,034 | 1/1997 | Baker, III et al. . | |
| 5,623,828 | 4/1997 | Harrington . | |
| 5,661,638 | * 8/1997 | Mira | 361/697 |
| 5,689,404 | * 11/1997 | Katsui | 361/697 |
| 5,760,333 | * 6/1998 | Kitahara et al. | 174/16.3 |
| 5,781,411 | * 7/1998 | Feenstra | 361/704 |
| 5,818,694 | 10/1998 | Daikoku et al. . | |
| 5,832,986 | 11/1998 | Kenny et al. . | |
| 5,860,472 | 1/1999 | Batchelder . | |
| 5,894,882 | * 4/1999 | Kikuchi et al. | 165/80.3 |
| 5,943,209 | * 8/1999 | Liu | 361/695 |
| 5,991,152 | * 11/1999 | Chiou | 361/704 |
| 5,992,511 | * 11/1999 | Kodaira et al. | 165/80.3 |
| 6,015,008 | * 1/2000 | Kogure et al. | 165/185 |
| 6,067,227 | * 5/2000 | Katsui et al. | 165/80.3 |
| 6,069,794 | * 5/2000 | Chuang | 361/697 |

* cited by examiner

Primary Examiner—Ira S. Lazarus
Assistant Examiner—Terrell McKinnon
(74) Attorney, Agent, or Firm—Blakely, Sokoloff, Taylor & Zafman LLP

(57) ABSTRACT

A device that efficiently transfers heat from a heat source. The device includes a heat sink, the heat sink comprising a thermally conductive base, and a plurality of thermally conductive pin fins coupled to the thermally conductive base. A gas source, such as a blower, proximate to the pin fins, directs a gas, such as ambient air, axially along at least a portion of the pin fins, and then in a direction radial to the pin fins and substantially parallel to the heat source, to transfer heat away from the heat source. The heat transfer device may be utilized in any application that requires efficient removal of heat from a heat source, for example, an electronic device such as an integrated circuit or microprocessor.

34 Claims, 11 Drawing Sheets

HEATSINK WITH INTEGRATED BLOWER FOR IMPROVED HEAT TRANSFER

BACKGROUND OF THE INVENTION

1. Field of the Invention

The present invention relates to a thermal dissipation device having improved surface area and fluid flow characteristics resulting in high thermal transfer efficiency.

2. Description of the Related Art

Thermal dissipation devices are present in a wide variety of applications, including electronic apparatus such as computers, stereos, televisions, or any other device that produces unwanted heat by inefficiencies in electronic circuits, such as integrated circuit chips (ICs), including microprocessors.

Among the factors that influence the design of a thermal dissipation device are the principles that: 1) increasing surface area of the thermal dissipation device generally improves thermal transfer, and 2) increasing fluid flow over the device generally improves thermal transfer. A heat sink is a thermal dissipation device, typically comprising a mass of material (generally metal) that is thermally coupled to a heat source and draws heat energy away from the heat source by conduction of the energy from a high-temperature region to a low-temperature region of the metal. The heat energy can then be dissipated from a surface of the heat sink to the atmosphere primarily by convection. A well known technique of improving the efficiency of a conductive heat sink is to provide a greater surface area on the heat sink, typically provided by fins that are formed on a base portion of the heat sink, so that more heat can dissipate from the heat sink into the atmosphere by natural (or free) convection. The thermal efficiency of a heat sink can be further increased by employing forced convection wherein a flow or stream of fluid, typically a gas such as air, is forced over and around the surface of the heat sink.

Current heat sinks increase surface area by including a number of raised, rectangular cross-section beams, or fins. If a heat source produces enough heat that forced convection is required to maintain the heat source within an appropriate operating temperature range, a fan is mounted to provide air flow over the fins to dissipate a greater amount of heat energy. For purposes of explanation, the heat source described herein is an integrated circuit (IC). However, it should be understood that the heat source may be any device that generates heat.

Some thermal dissipation devices use rod-shaped pins ("pin fins"), as illustrated in the cross sectional side view in FIG. 1. Pin fins 102 are in thermal contact with and extend from the top of base 101 of heatsink 100. The pins may be integrally formed or later affixed to the base 101. Each pin has a diameter D, an overall length L, and if applicable, a depth B of insertion into the base 101. While the pins are illustrated as being of circular cross-section, any suitable cross section may be employed, with the understanding that a smooth, circular cross section minimizes air flow resistance, while rough, square, complex (e.g., star shaped) or irregular cross section will increase airflow resistance and surface area available for convection.

The base, or plate, of the heat sink device may have a flat surface or curved surface in different embodiments. The bottom surface of base 101 generally is coupled directly, or indirectly, to the IC to dissipate heat from the IC. The heat travels through the heat sink base 101 and then through pins 102 by conduction. At the top surface of base 101 and the surface of pins 102, the heat is dissipated into the atmosphere by natural or forced convection. A fan commonly is utilized to generate additional airflow across heat sink 100 to dissipate a greater amount of heat energy. FIG. 2 provides a top view in which a number of pins rise from base 101, spaced and aligned to form a grid on the top surface of the base 101 of heat sink 100.

Presently, pin fins are limited by a relatively low length: width ratio. Reasonably inexpensive pin fins generally are limited to a length:width ratio of approximately 8:1, in part due to their being fabricated by casting. More expensive pin fins might reach a length:width ratio as high as 15:1. Due to limitations of known manufacturing methods, there is a trade off between length:width ratio and occupancy ratio.

With reference to FIG. 3, occupancy ratio is measured as the percentage of surface area of the body of a heat sink that is occupied by the cumulative cross sectional area of the pin fins. In the case of a square or rectangular area on the surface of the heat sink, the pins, of radius R, are arranged in rows on dimension X centers and in columns on dimension Y centers. The combination of pins in rows and columns forms a grid pattern. In this case, the occupancy of the overall grid is measured by taking the occupancy of one X-by-Y area:

overall area=XY rod area=$\pi R^2$ and thus occupancy ratio is $\pi R^2/XY$. In the case of a square grid, where X and Y are equal and the rows and columns are at right angles, occupancy can be stated more simply as an occupancy ratio $\pi D/4X$ where D is the diameter of the pins and X is the on-center distance between the pins. Given small geometries and large pin heights in relation thereto, existing pin fin architectures are limited to a fairly low occupancy ratio, principally governed by existing manufacturing methods. Prior thermal dissipation systems rely on natural, or forced convection generated by a fan or other inefficient air flow device. The heat sinks employ fins and generally mount the fan or blower adjacent or above the heat sink fins. In these and other prior art systems, the challenge is generating sufficient airflow past a maximum amount of surface area of the heat sink, while minimizing manufacturing cost and space requirements.

BRIEF DESCRIPTION OF THE SEVERAL VIEWS OF THE DRAWINGS

The present invention is illustrated by way of example and not limitation in the following figures. Like references indicate similar elements, in which.

DETAILED DESCRIPTION OF THE INVENTION

A method and an apparatus for improving the thermal efficiency of heat sinks is described. In the following description, for purposes of explanation, numerous details are set forth in order to provide a thorough understanding of the present invention. However, it will be apparent to one skilled in the art that these specific details are not required in order to practice the present invention.

Figure 1:
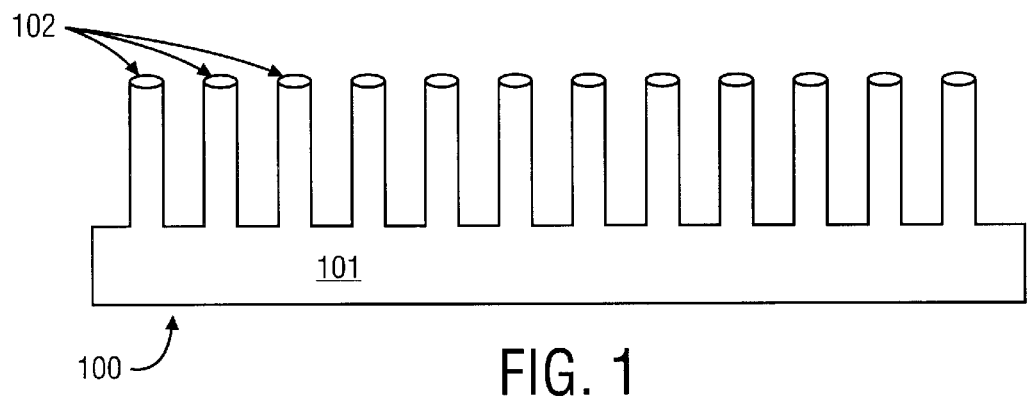
FIG. 1 shows a cross-section of the body of a prior art thermal dissipation device.
Figure 2:
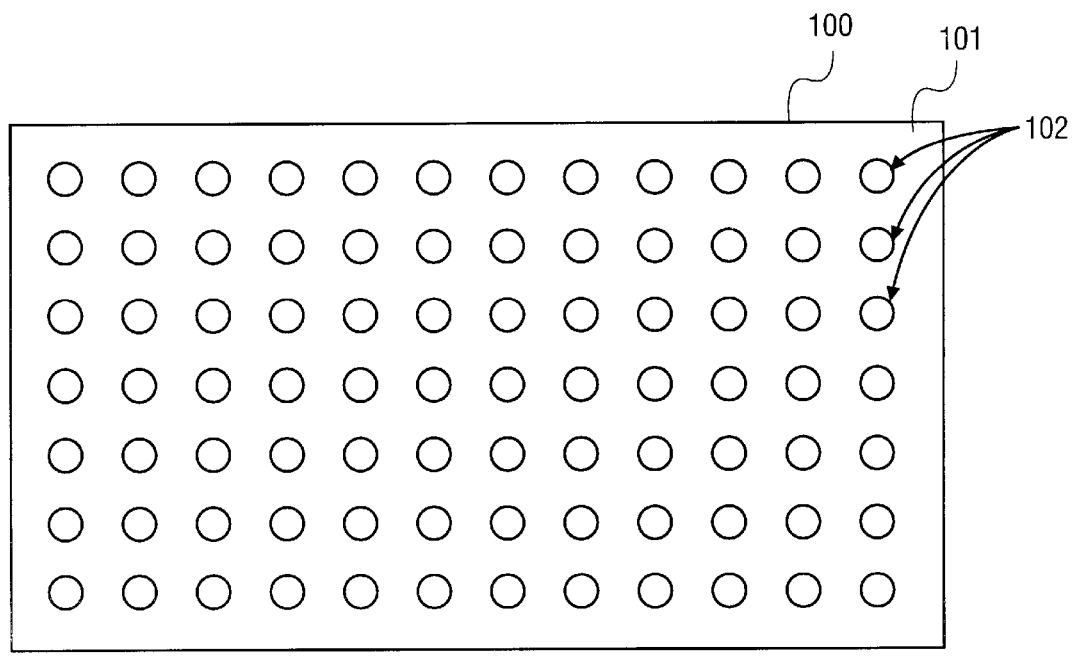
FIG. 2 show a top view of the body of a prior art thermal dissipation device.
Figure 3:
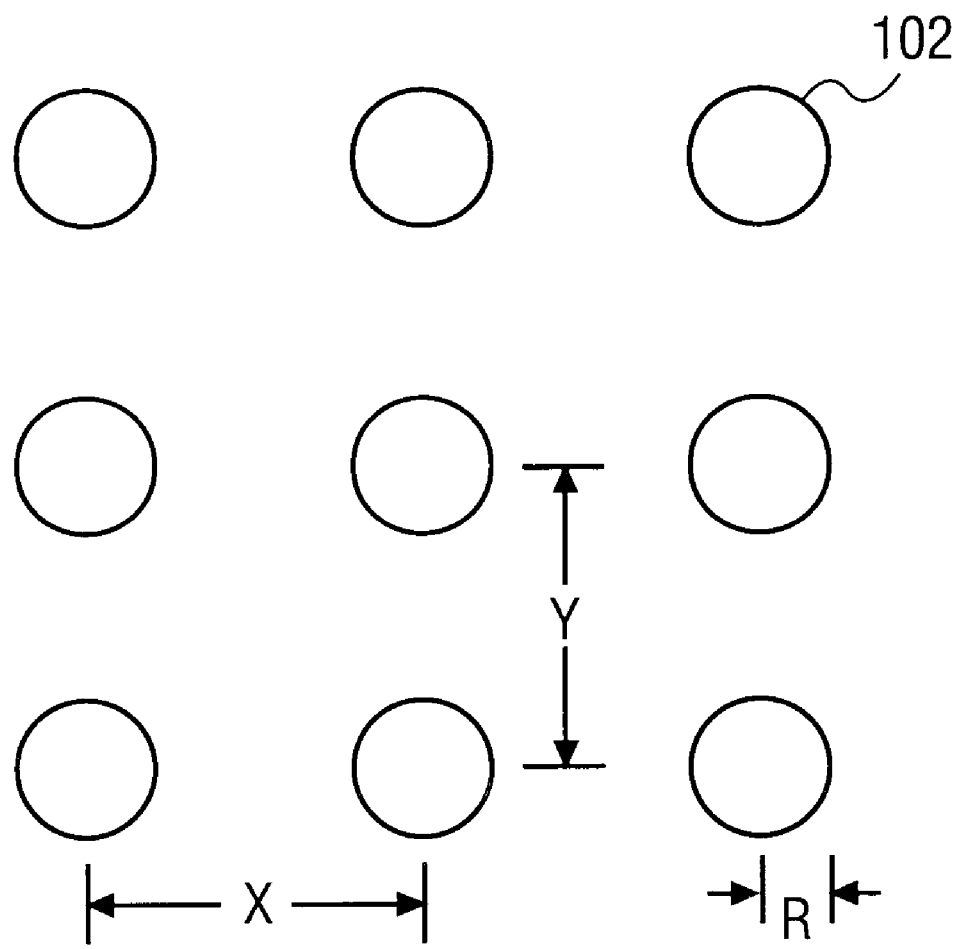
FIG. 3 shows a grid array of pin fins for a prior art thermal dissipation device.
Figure 4:
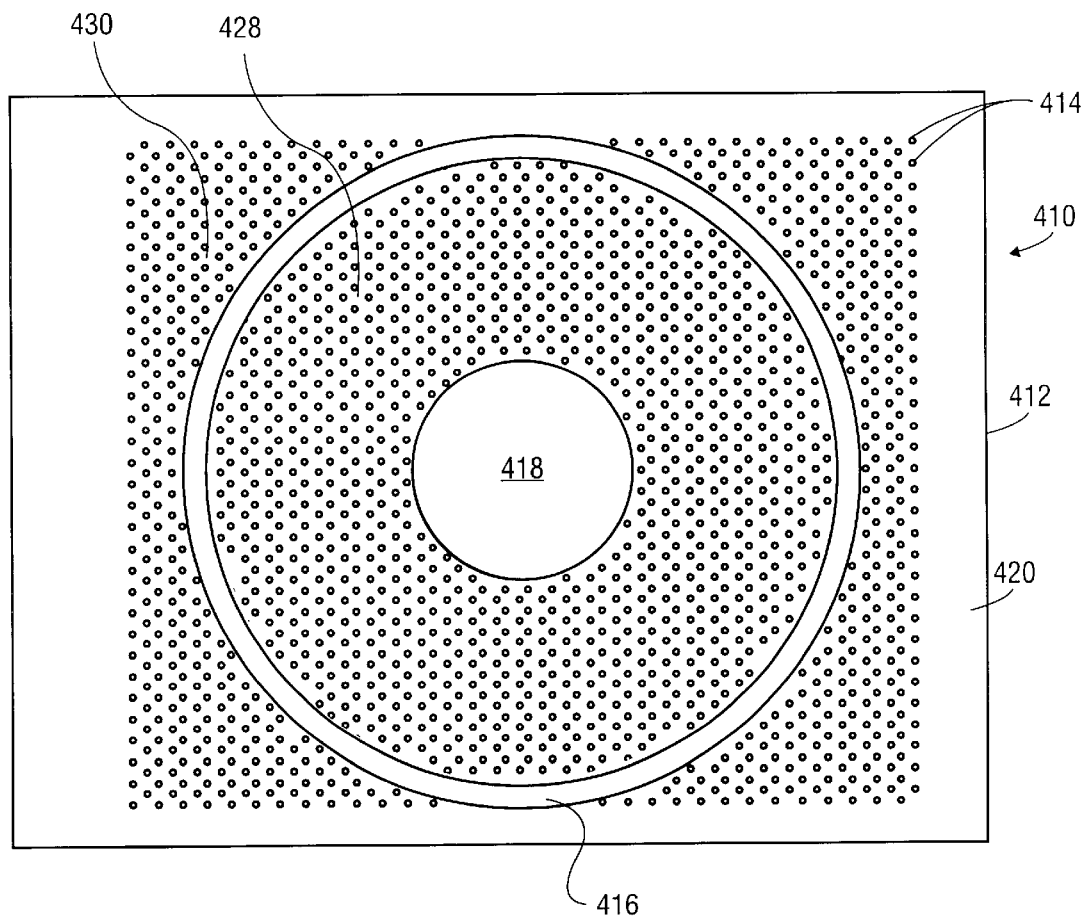
FIG. 4 illustrates a grid array of pin fins as may be utilized by an embodiment of the present invention.

An embodiment of the invention is now described with reference to FIGS. 4 and 5. FIG. 4 illustrates a thermal dissipation device 410, and particularly illustrates the distribution of the pins 414, i.e., the overall manner in which the pins 414 are organized about the base 412. FIG. 4 shows a distribution in which there are spaces 416 and 418 within the grid of pins where there are no pins, and a space 420 outside the grid where there also are no pins. Other distributions are, of course, capable of being implemented, according to the design requirements of the particular application. An inner plurality 428 of pins 414 is defined by the region of base 412 between spaces 418 and 416. An outer plurality 430 of pins 414 is defined by the region of base 412 between spaces 416 and 420.

Figure 5A:
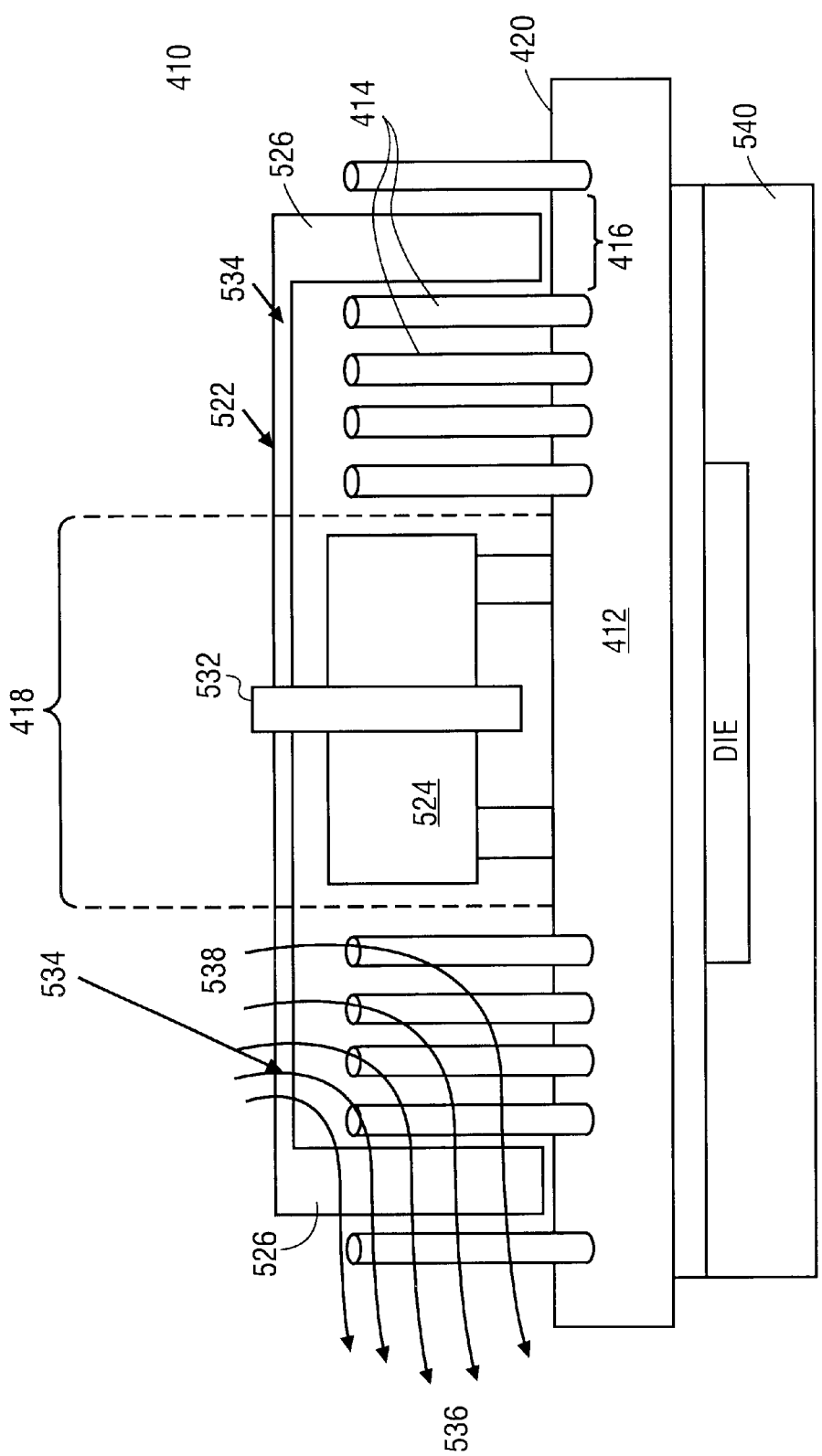
FIG. 5A illustrates an embodiment of the present invention.

FIG. 5A illustrates an application in which the distribution of pins 414 illustrated in FIG. 4 is particularly useful. The thermal dissipation device 410 in this embodiment includes a blower 522. The blower includes a motor 524 that is affixed (by any conventional means) to the base 412 of thermal dissipation device 410 within space 418. In another embodiment of the present invention, the motor 524 is in contact with the perimeter of the blower. In the latter configuration, bearings or the like support the blower, providing sufficient support to prevent wobble, within the tolerances of the bearings.

The vanes 526 of the blower are positioned to operate in space 416. Space 416 permits the blower to substantially enclose an inner plurality 428 of the pins. This is desirable because, as shown, the inner plurality 428 of pins 414 that is within the blower is subjected to airflow 538 that is substantially axial, for at least a portion of the length of those pins. This axial airflow has a significant beneficial effect on the thermal efficiency of the thermal dissipation device 410. Moreover, the axial airflow exposes more of the surface area of the pins to airflow.

The axial airflow also allows for a greater occupancy ratio for plurality 428 of pins 414, without significantly increasing air resistance, due to the axial direction of air flow over the plurality 428. This greater occupancy ratio increases the heat transfer efficiency of the heat sink by increasing the surface area available for dissipation of heat.

Furthermore, although the outer plurality 430 of pins 414 that are not enclosed will not necessarily have a significant axial component to the airflow 536 about them, they still contribute to the total thermal capacity of the device 410.

Figure 5B:
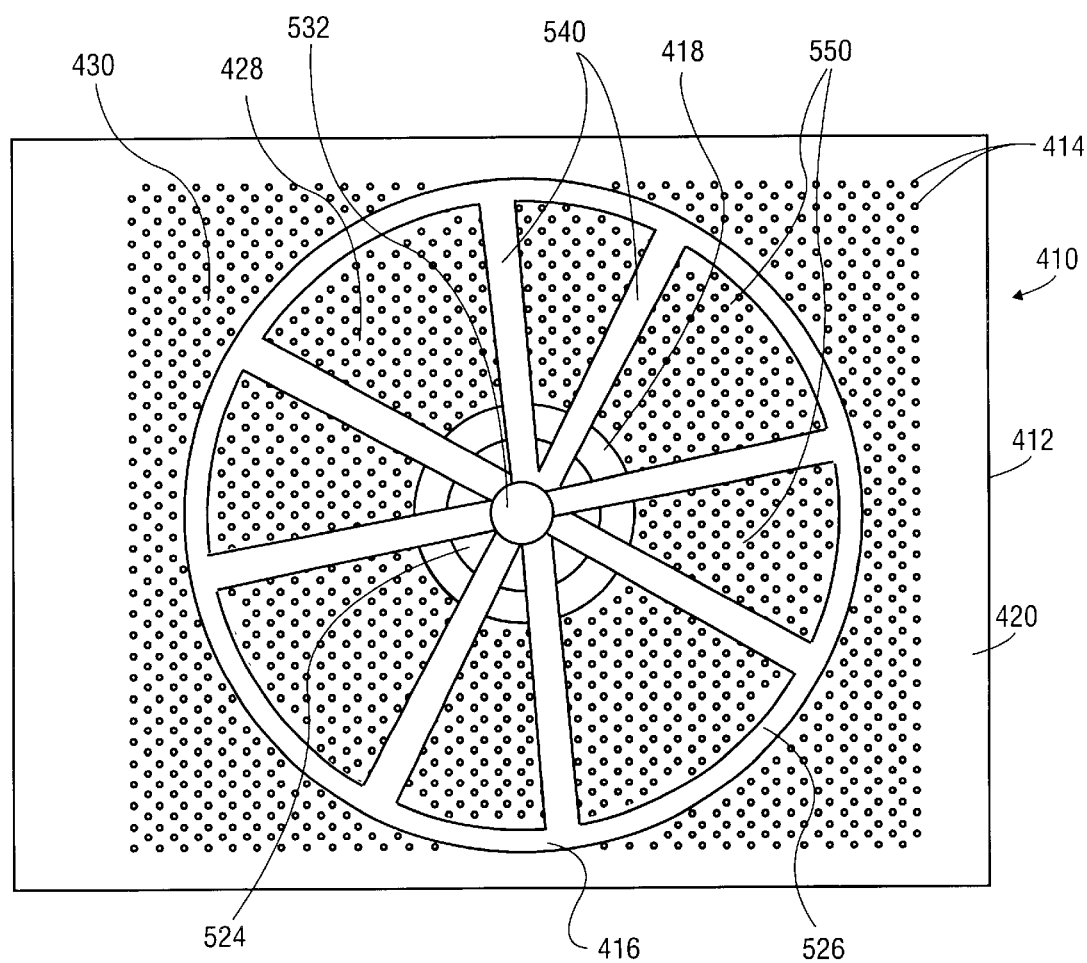
FIG. 5B illustrates an embodiment of the present invention.

FIG. 5A also illustrates that the vanes 526 are coupled to an axle 532 of the blower's motor 524 by a face element 534. Face element 534 may be substantially planar, in one embodiment, and lies generally in a plane that is perpendicular to the axis about which the blower rotates. With reference to FIG. 5B, in one embodiment, the face comprises a plurality of spokes 540 that couple the vanes to the motor, and a plurality of openings 550 through which air flows onto the pin. This is a conventional blower design. In another embodiment, the blower does not have an axially mounted motor nor spokes. Rather, the blower 522 is supported at its perimeter by a bearing means that may support the blower at its perimeter, or from the bottom. In such a case, the rotational force needs to be applied to the blower at its perimeter.

The vanes 526 are the functional elements that cause air to flow, and are disposed about the perimeter of the blower. The illustration in FIG. 5A shows the blower drawing air axially down through face element 534 and out across vanes 526.

FIG. 5A further illustrates an application of the thermal dissipation device 410 for cooling an integrated circuit (IC) package 540.

While FIG. 5A illustrates the use of a blower to provide axial airflow 538 about the pins 414, in some applications, it may be acceptable or even required to use an air moving device other than a blower. In some applications, a propeller or screw may be most suitable. In other cases, an impeller or a pump may be most suitable. In these cases, it is still desirable to achieve axial airflow about the pins, to the extent possible. Note that radial airflow is beneficial, and that at the inside periphery of the blower wheel, airflow is almost entirely radial.

It is further understood that the base and the pins may be constructed of any suitable materials, according to the requirements of the particular application. It is well known that metals provide good thermal transfer, as well as durability. However, other materials may certainly be utilized, within the scope of this invention. Preferably, a metal such as copper is used because of its high thermal conductivity. Other materials such as aluminum, steel, metal filled plastic, or various alloys of metal such as aluminum, zinc, or other thermally conductive metals can also be used for device 410.

Figure 6:
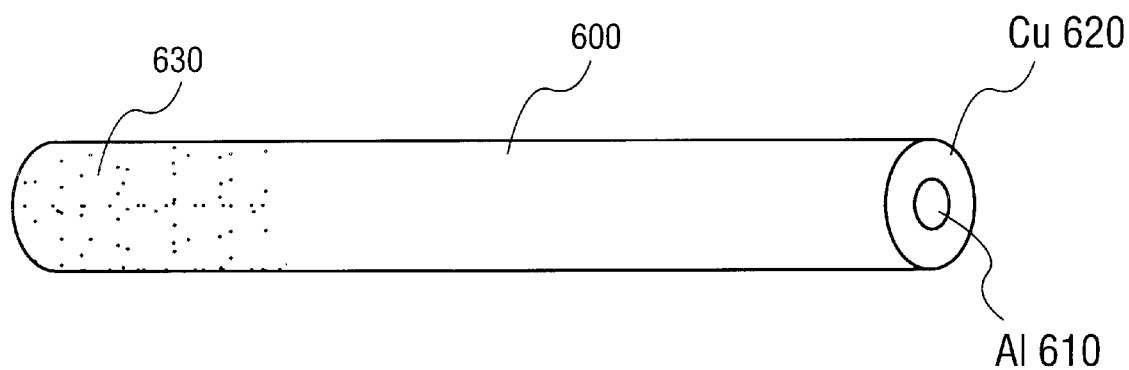
FIG. 6 shows a cross-section of one embodiment of a pin fin.

FIG. 6 illustrates one embodiment of the materials of a pin fin. In this embodiment, the pin 600 includes an alloy clad with heterogeneous materials to provide sufficient rigidity, strength and thermal conductivity to allow for desired height to width pin ratios. For example, pin 600 may include a steel core 610 surrounded by a copper jacket 620. In such an embodiment, the pin provides good thermal conductivity from the copper sheath and high strength from the steel core. This configuration gives the pin increased axial strength, and, in many applications, is better suited to insertion into a body which does not have pre-drilled holes.

FIG. 6 further illustrates another, independent principle which may optionally be used in an embodiment of the invention. The pins and/or the base of the heat sink (not shown) may be formed with a microporous surface 630 to increase the effective surface area The degree to which the pins are textured is determined by trading off increased surface area against increased resistance to air flow, according to the application's demands.

Figure 7:
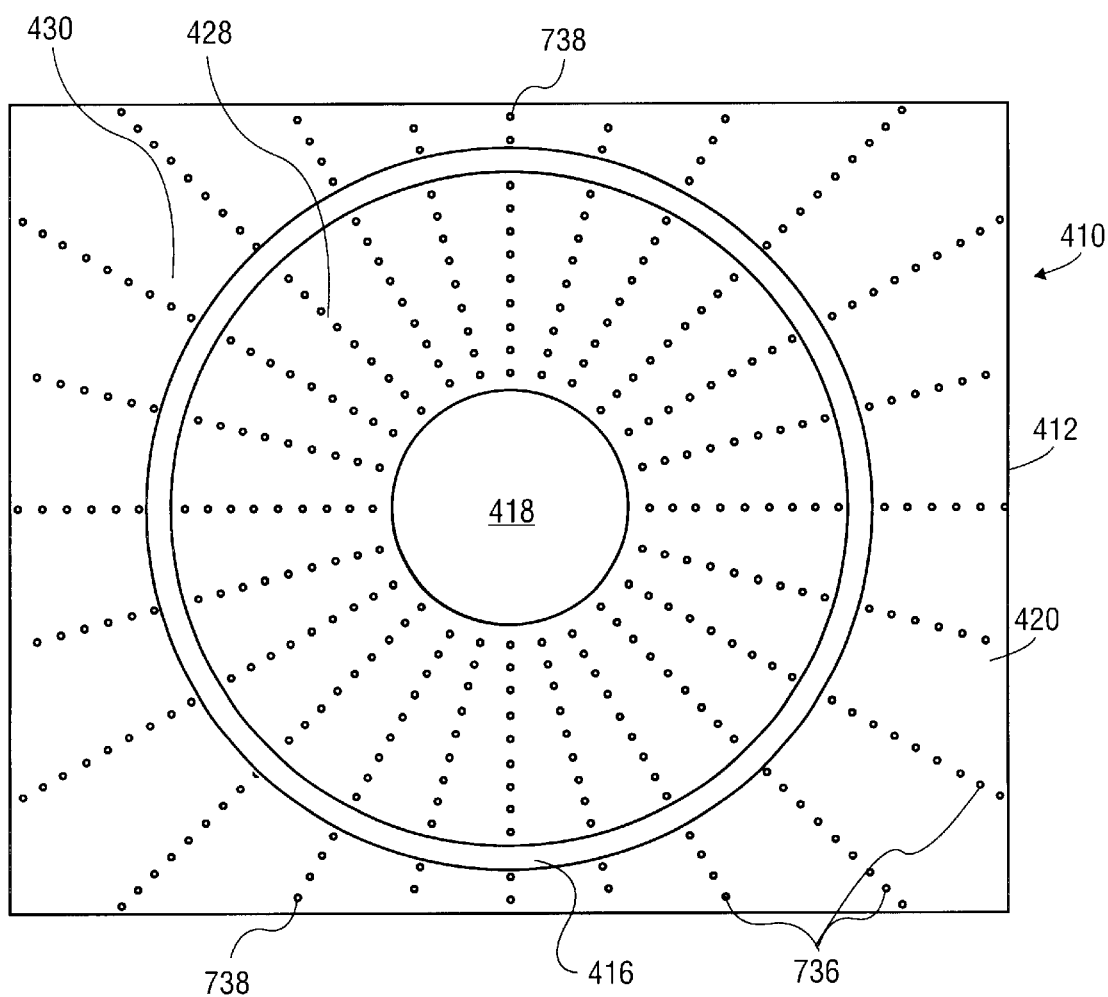
FIG. 7 shows one exemplary pin fin pattern arrangement.

FIG. 7 illustrates an axial grid, in which the pins may be distributed over the base of heat sink. A plurality of substantially linear rows 736 of pins extend axially outward from the center, such as from an opening 418 as discussed above. As the rows extend outward, the distance between adjacent rows increases. If the rows are sufficiently long that the empty space in this increased distance becomes wasteful or less than thermally optimal, the device may further include optional shorter, substantially linear rows 738 which do not extend as far inward as the other rows 736. As will be understood, there may be more than two lengths of such rows, extending to more than two distances from the center, as needed.

Figure 8:
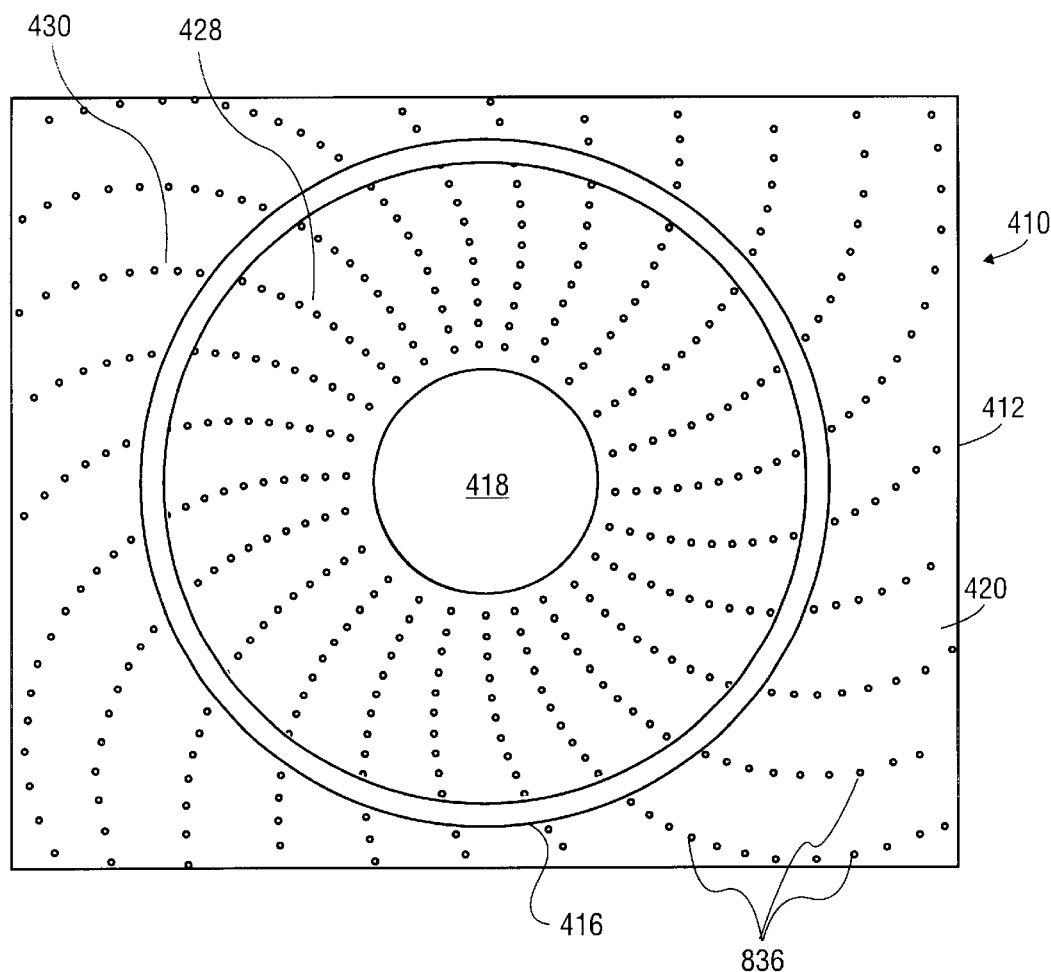
FIG. 8 shows another exemplary pin fin pattern arrangement.

FIG. 8 illustrates an alternative configuration, in which the grid is a spiral. In the spiral grid configuration, there is a plurality of curved rows 836 of pins. The rows may have arc curvature, elliptical curvature, or other suitable curvature, according to the application's requirements. As with the axial grid, there can be rows of varying lengths, to maintain the occupancy ratio across the device. In some applications, the amount and direction of curvature of the rows may be selected according to the air flow desired. For example, if the air exiting the blower (not shown) tends to curve rather than simply radiate directly, radially outward, it may be desirable to use a spiral grid to maximize airflow over the pins that lie outside the blower.

In any type of configuration, whether it is a rectangular grid, axial grid, spiral grid, or other, e.g., an interstitial grid wherein the pins are situated near one another but not necessarily aligned in accordance with any particular grid or pattern, the principles taught above with reference to FIGS. 4 and 5 may be utilized.

Figure 9:
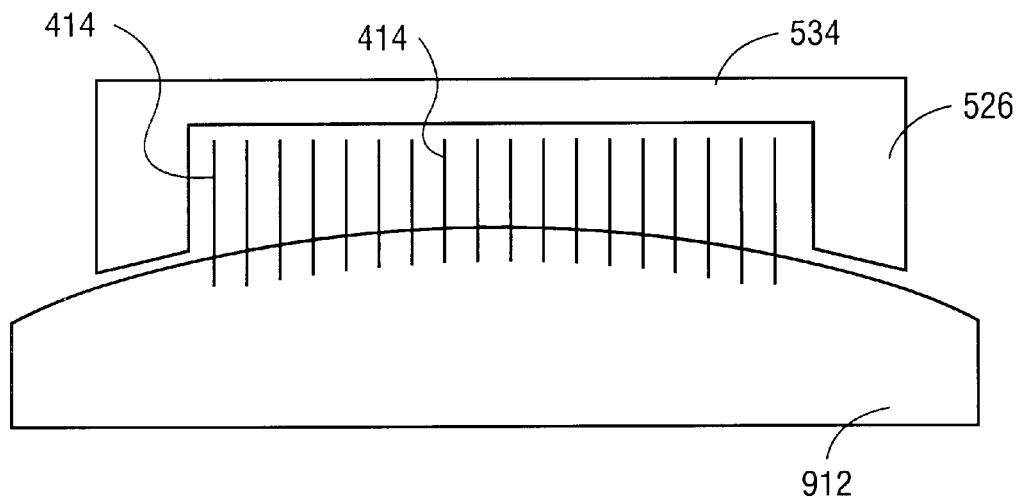
FIG. 9 illustrates another embodiment of the present invention.

FIG. 9 illustrates another aspect of the pin fin configuration. In some applications, it may be desirable to enclose the maximum possible total pin length within the blower. In such cases, it is desirable that all the pins extend as close as possible to the face 534 of the blower. If the underlying base 912 has a surface which is significantly non-planar, then pins 414 of varying lengths will need to be used, as will be understood from FIG. 9.

Figure 10:
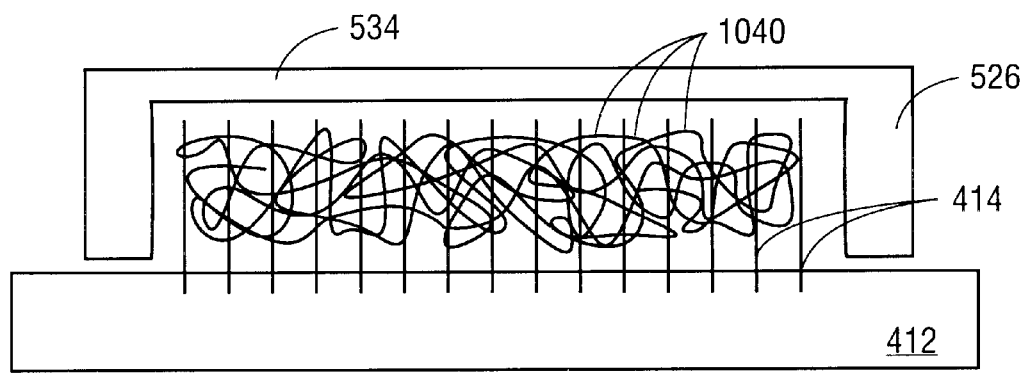
FIG. 10 illustrates another embodiment of the present invention.

FIG. 10 illustrates a hybrid embodiment, in which the pins 414 are supplemented with another thermal dissipation means 1040. In one embodiment, this may be a metallic wool which is interspersed within, and in thermal contact with, the array of pins. Consideration should be paid to the tradeoff between increased surface area and decreased air flow, as the application dictates. For example, in some applications, where the dimensions of the device are limited by external constraints to a very small size, an extremely high air pressure may be available. In such a case, because thermal transfer does not increase forever as air velocity increases, it may be impossible to achieve sufficient thermal transfer using only the pins, and the addition of metallic wool 1040 may provide enough added surface area to accomplish the necessary thermal transfer.

Figure 11:
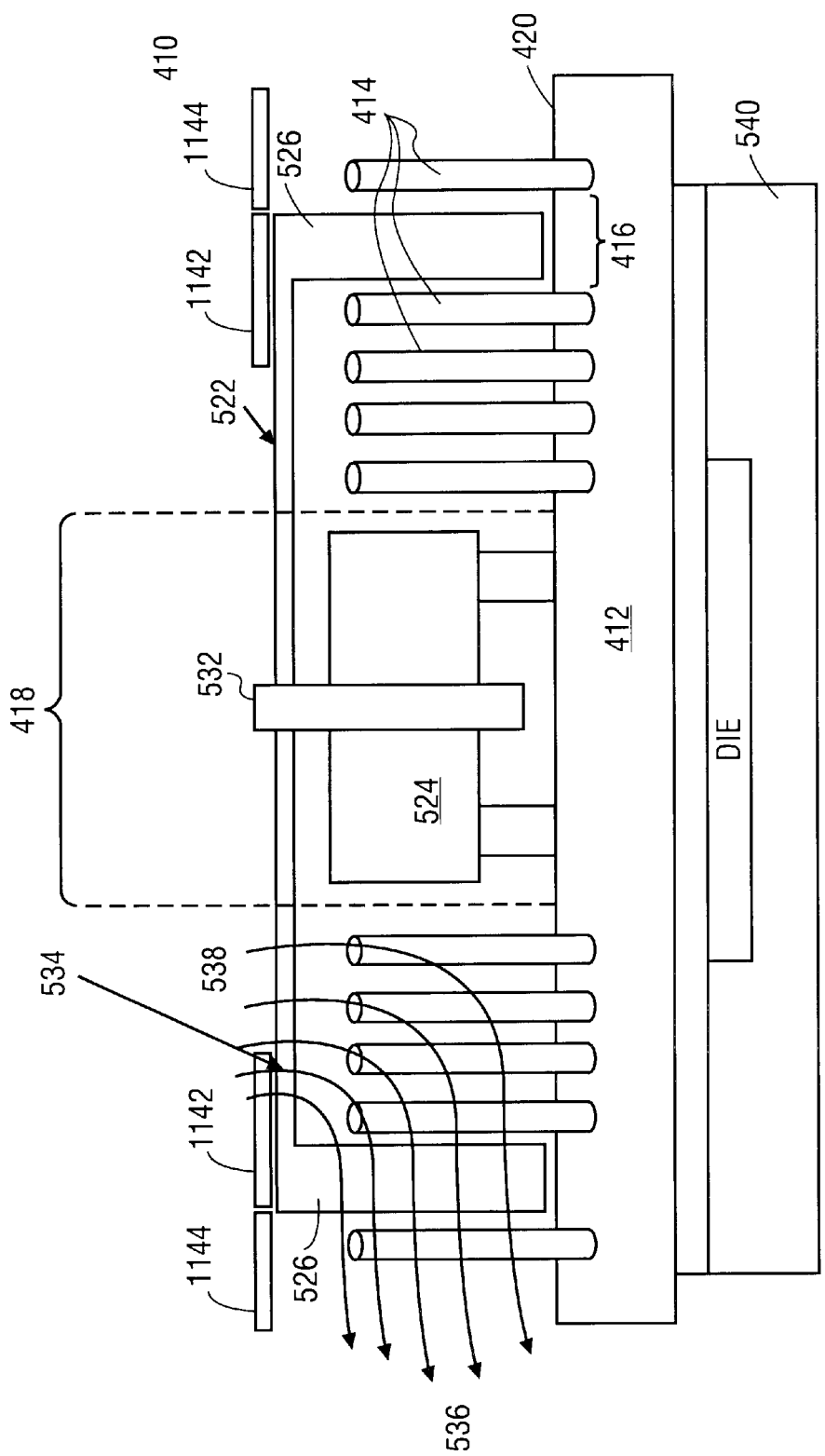
FIG. 11 illustrates another embodiment of the present invention.

FIG. 11 illustrates yet another enhancement that can be made to improve the thermal transfer of the heat sink device of the present invention. In the embodiment shown, the blower 522 is improved with the addition of a constriction ring 1142, which is a thin, substantially ring-shaped member attached to, very near to, or integral with the face of the blower, generally near the blower's outer perimeter. The constriction ring serves to prevent air from being drawn in near the perimeter. Air being drawn in near the perimeter tends to provide little cooling as it passes over only a very small number of pins before being expelled through the vanes of the blower. In the worst case, the air may pass over only a small fraction of the length of the outermost pins. The dimensions of the constriction ring, and specifically the distance that the constriction ring extends inward from the vanes 526, depends on the demands of the particular application. FIG. 11 also illustrates another, similar improvement, with the addition of a deflector 1144. Unlike the constriction ring, the deflector is positioned outside the perimeter of the vanes 526. Like the constriction ring, the purpose of the deflector is to control air circulation to improve thermal performance. The deflector prevents hot air from looping from the output of the blowers to the input of the face 534.

The constriction ring and the deflector may, independently, be coupled to the blower to rotate with the vanes, or to the base of the heat sink device to remain stationary. If coupled to the blower, they increase the rotating mass. If coupled to the body, they should not interfere with the blower's rotation. Either of these issues should be taken into consideration, according to the design requirements of the blower or the overall system. A design may include a constriction ring, a deflector, both, or neither.

Figure 12:
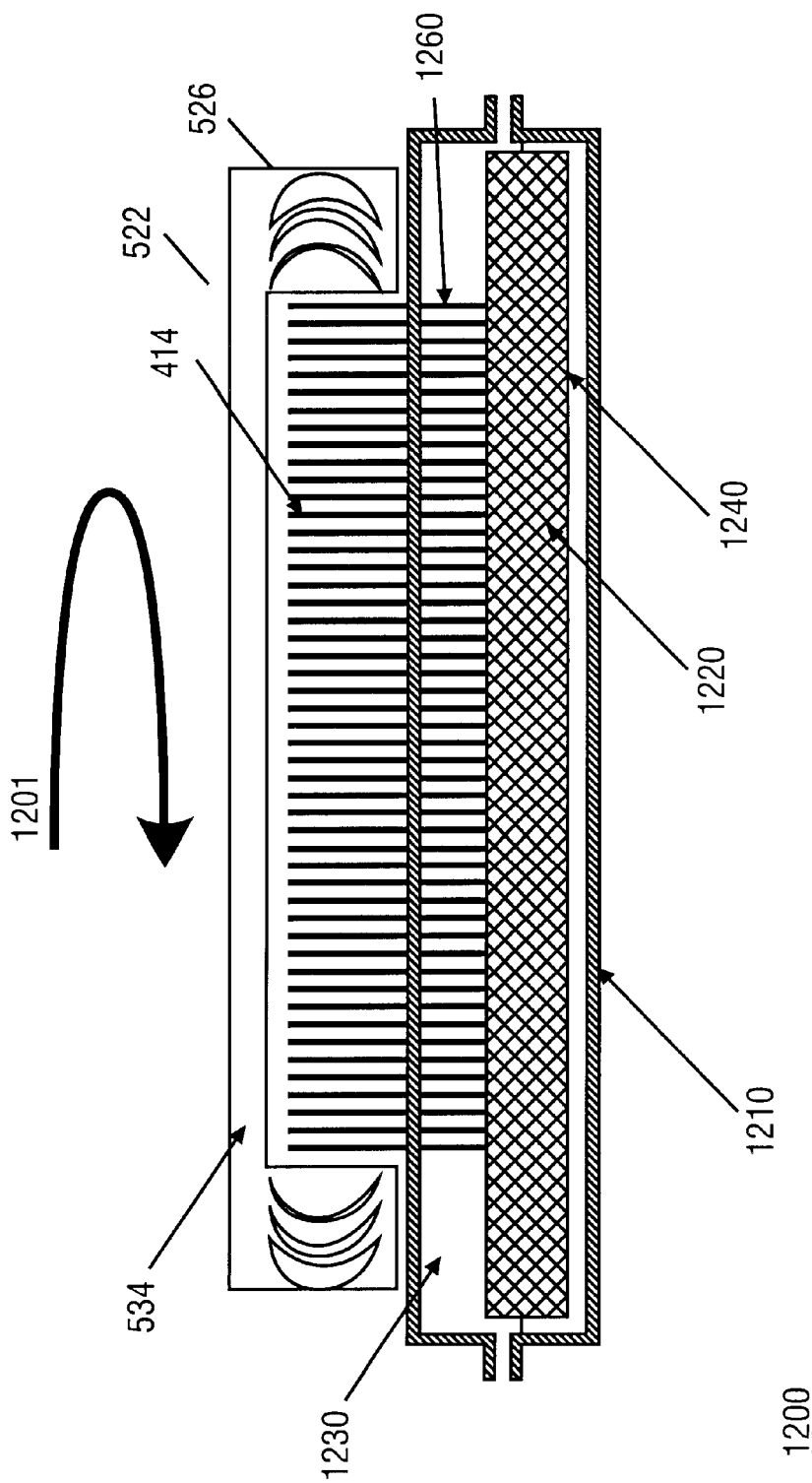
FIG. 12 illustrates another embodiment of the present invention.

With reference to FIG. 12, another embodiment 1200 of the present invention is described in which a vessel, commonly referred to as a heat pipe, is utilized to further spread heat generated by the heat source. The blower 522 encompasses the pins 414 as in previously described embodiments, and rotates in the direction illustrated by arrow 1201. The blower sits on a heat pipe, more specifically, on a heat pipe housing 1210. The heat pipe comprises a wick 1220, a working fluid 1240 and a vapor chamber 1230, and provides lateral heat transfer via a vapor transported through the vapor chamber. While the heat pipe as illustrated is rectangular in shape, it is understood that other heat pipe dimensions may be utilized, such as square or cylindrical. If the heat source is relatively small, e.g., a microprocessor die, then a significant portion of the heat that needs to be dissipated from the heat source has to migrate laterally along the base of the heat sink. In the embodiment illustrated in FIG. 12, a flat heatpipe efficiently spreads the heat to the entire top surface of the heat sink. The combination of the flat heatpipe and the blower encompassed heat sink improves the rate of heat dissipation.

The heat pipe, in one embodiment, is formed of copper or aluminum sheet metal that encloses the working fluid 1240 (e.g., water under a vacuum) and the wicking substance 1220. The pin fins 414 are illustrated in this embodiment as penetrating at the top portion 1260 of the heatpipe and protruding into the vapor chamber 1230 to subject the pins to the vaporized working fluid. However, it is understood that the pins need not penetrate the top surface of the heat pipe, but affixed to the top surface of the heatpipe. The working fluid evaporates in the region of high temperature and rapidly flows to the cooler areas, yielding its heat to the pins coupled to the top plate, or coupled to and protruding through the top plate of the heat pipe, depending on the embodiment. The blower then dissipates the heat in the manner described above. Having the pins protruding directly into the fluid vapor permits the use of the relatively large surface area inherent in the pin fins for thermal transfer, at only a marginal increase in the manufacturing process to press the pins into the heat pipe's metal housing.

For the sake of simplicity, this patent discusses the cooling fluid as though it were air, but this is not a necessary limitation, and the invention may be utilized in the presence of any suitable fluid, liquid, gas, or other environment. In some cases, the existing fluid is not sufficient, and the performance of the thermal dissipation device can be improved by augmenting or replacing the fluid with another fluid.

The invention has been discussed in the context of a separate cooling device that is placed into thermal contact with a heat generating device such as an engine or a computer chip. However, in some cases, it may be desirable to utilize the base or surface of the heat generating device itself as the base of the cooling device, as is done with air cooled motorcycle engines. In this case, the pins 414 are coupled directly to the surface of the engine or other heat source. In the case of an internal combustion engine, the pins may be coupled to a variety of members, such as the cylinder wall, the head, the exhaust header, and so forth. And, of course, they may also be used with the radiator, oil cooler, transmission fluid cooler, air conditioning heat exchanger, and so forth.

While the invention has been described with reference to specific modes and embodiments, for ease of explanation and understanding, those skilled in the art will appreciate that the invention is not necessarily limited to the particular features shown herein, and that the invention may be practiced in a variety of ways that fall under the scope and spirit of this disclosure. The invention is, therefore, to be afforded the fullest allowable scope of the claims that follow.

What is claimed is:

1. An apparatus comprising:
    a thermally conductive base;
    a plurality of thermally conductive pins coupled to the thermally conductive base; and
    a blower having a circular face element and vanes disposed about the perimeter of the face element, the face element and vanes encompassing the plurality of pins wherein the blower is rotatable about an axis generally parallel to the pins to direct a gas over the pins in a direction substantially axial to the pins.

2. The apparatus of claim 1, wherein the pins have an irregular cross section to increase surface area available for convection.

3. The apparatus of claim 1, wherein the pins have a star shape to increase surface area available for convection.

4. The apparatus of claim 1 wherein the plurality of pins is an inner plurality of pins coupled to the base in an area encompassed by the blower, and the apparatus further comprises an outer plurality of pins coupled to the base in an area outside of the area encompassed by the blower.

5. The apparatus of claim 1 wherein the pins are coupled to the base in a circular area, the circular area is non-planar, and the plurality of pins are of varying lengths such that the ends of the pins are substantially planar.

6. The apparatus of claim 1 further comprising metallic wool dispersed among the plurality of pins and in thermal contact with at least a subset of the pins.

7. The apparatus of claim 1 wherein the blower includes a motor having an axle and is mounted to the base with the axle substantially normal to a plane of the base, wherein the blower is coupled to base via the axle.

8. The apparatus of claim 1 further comprising a constriction ring coupled to the apparatus near an inner perimeter of the blower, to prevent intake of the gas near the inner perimeter.

9. The apparatus of claim 8 wherein the constriction ring is coupled to the blower.

10. The apparatus of claim 1 further comprising a deflector coupled to the apparatus near an outer point of the blower, to prevent recirculation of the gas near the outer perimeter.

11. The apparatus of claim 1 wherein the base includes a housing defining a vapor chamber.

12. The apparatus of claim 11 wherein the plurality of pins is coupled to the housing.

13. The apparatus of claim 11 wherein at least some of the plurality of pins have a first portion extending outside the housing and a second portion protruding into the vapor chamber.

14. The apparatus of claim 11 wherein the vapor chamber comprises a heat pipe.

15. A heat removal system, comprising:
    a heat sink coupled to a heat source, said heat sink having an inner plurality of pin fins and an outer plurality of pin fins each coupled to a base;
    a gas source coupled to said heat sink to direct gas over said inner and outer plurality of pin fins, said gas source encompassing said inner plurality of pin fins.

16. The heat removal system of claim 15, wherein said gas source comprises a blower.

17. The heat removal system of claim 15, wherein the gas is air.

18. The heat removal system of claim 15, wherein the heat source is an electronic device.

19. The heat removal system of claim 18, wherein the electronic device is an integrated circuit.

20. The heat removal system of claim 19, wherein the integrated circuit is a microprocessor.

21. The heat removal system of claim 15, wherein the gas source directs gas over said inner plurality of pins in a direction substantially axial with said inner plurality of pin fins and over said outer plurality of pin fins in a direction substantially radial with said outer plurality of pin fins.

22. The heat removal system of claim 21, wherein said gas comprises air.

23. The heat removal system of claim 15 wherein the heat sink base and pin fins are comprised of metal.

24. The heat removal system of claim 16 wherein the inner and outer plurality of pin fins are distributed over a top surface of the base in a substantially regular pattern.

25. The heat removal system of claim 15 wherein the inner plurality of pin fins are coupled to the base in a circular area, the circular area is non-planar, and the inner plurality of pin fins are of varying lengths such that the ends of the pin fins are substantially planar.

26. The heat removal system of claim 15 further comprising metallic wool dispersed among the inner plurality of pin fins and in thermal contact with at least a subset of the inner plurality pin fins.

27. The heat removal system of claim 16 wherein the blower includes a motor having an axle and is mounted to the base with the axle substantially normal to a plane of the base, wherein the blower is coupled to base via the axle.

28. The heat removal system of claim 16 further comprising a constriction ring coupled to the heat removal system near an inner perimeter of the blower, to prevent intake of the gas near the interior perimeter.

29. The heat removal system of claim 8 wherein the constriction ring is coupled to the blower.

30. The heat removal system of claim 16 further comprising a deflector coupled to the apparatus near an outer perimeter of the blower, to prevent recirculation of the gas near the outer perimeter.

31. The heat removal system of claim 15 wherein the base includes a housing defining a vapor chamber.

32. The beat removal system of claim 31 wherein the inner and outer pluralities of pin fins are coupled to the housing.

33. The heat removal system of claim 31 wherein at least some of the pin fins have a first portion extending outside the housing and a second portion protruding into the vapor chamber.

34. The heat removal system of claim 31 wherein the vapor chamber comprises a heat pipe.

* * * * *